(12) United States Patent
Wood et al.

(10) Patent No.: US 7,214,566 B1
(45) Date of Patent: May 8, 2007

(54) SEMICONDUCTOR DEVICE PACKAGE AND METHOD

(75) Inventors: Alan G. Wood, Boise, ID (US); Larry D. Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 09/594,510

(22) Filed: Jun. 16, 2000

(51) Int. Cl.
*H01L 21/66* (2006.01)
*H01L 21/44* (2006.01)
*H01L 21/48* (2006.01)
*H01L 21/50* (2006.01)

(52) U.S. Cl. .......................... 438/110; 438/15; 438/113

(58) Field of Classification Search ................. 438/15, 438/110, 113, 114, 455–462, 464
See application file for complete search history.

(56) References Cited

U.S. PATENT DOCUMENTS

| | | | |
|---|---|---|---|
| 3,918,148 A | 11/1975 | Magdo et al. | |
| 4,781,969 A * | 11/1988 | Kobayashi et al. | 428/209 |
| 5,073,840 A | 12/1991 | Coors | |
| 5,134,539 A | 7/1992 | Tuckerman et al. | |
| 5,137,836 A * | 8/1992 | Lam | 438/15 |
| 5,143,865 A | 9/1992 | Hideshima et al. | |
| 5,696,033 A | 12/1997 | Kinsman | |
| 5,734,201 A | 3/1998 | Djennas et al. | |
| 5,770,032 A | 6/1998 | Cane | |
| 5,796,170 A | 8/1998 | Marcantonio | |
| 5,808,874 A * | 9/1998 | Smith | 361/769 |
| 5,817,535 A | 10/1998 | Akram | |
| 5,834,320 A * | 11/1998 | Huddleston et al. | 438/3 |
| 5,834,839 A | 11/1998 | Mertol | |
| 5,858,815 A * | 1/1999 | Heo et al. | 438/112 |
| 5,897,337 A * | 4/1999 | Kata et al. | 438/114 |
| 5,977,629 A | 11/1999 | Fogal et al. | |
| 5,989,982 A * | 11/1999 | Yoshikazu | 438/462 |
| 6,020,626 A * | 2/2000 | Ohsawa et al. | 257/668 |
| 6,064,217 A * | 5/2000 | Smith | 324/760 |
| 6,077,757 A * | 6/2000 | Mizuno et al. | 438/465 |
| 6,111,313 A | 8/2000 | Kutlu | |
| 6,153,448 A * | 11/2000 | Takahashi et al. | 438/114 |

(Continued)

FOREIGN PATENT DOCUMENTS

JP    03227042 A    10/1991

*Primary Examiner*—Chuong Anh Luu
(74) *Attorney, Agent, or Firm*—Dickstein Shapiro LLP

(57) ABSTRACT

A method of making semiconductor device packages includes the steps of attaching a wafer to a dielectric layer, testing semiconductor devices in the wafer, and then dicing the layered assembly. The dielectric layer may be, for example, a flexible tape. The semiconductor devices may be chips containing integrated circuits or memory devices. The dicing operation may be performed by a circular saw or by another suitable apparatus. The chips may be connected to input/output devices, such as ball grid arrays, on the dielectric layer, before the testing and dicing steps. Full wafer testing may be-conducted through the ball grid arrays. A relatively stiff metal sheet may be included in the layered assembly before the testing and dicing steps. The metal material may be used as heat spreaders and/or as electrical ground planes. The chips may be connected to the ball grid arrays by wire bonds or flip chip bumps and vias through the dielectric layer. Alignment of the wafer with respect to the dielectric tape may be accomplished by an optical device or by a magnetic system.

28 Claims, 6 Drawing Sheets

U.S. PATENT DOCUMENTS

| | | |
|---|---|---|
| 6,160,714 A | 12/2000 | Green |
| 6,163,956 A * | 12/2000 | Corisis .................. 29/832 |
| 6,165,885 A * | 12/2000 | Gaynes et al. ............. 438/612 |
| 6,175,084 B1 | 1/2001 | Saitoh et al. |
| 6,268,236 B1 * | 7/2001 | Miyawaki .................. 438/106 |
| 6,268,650 B1 | 7/2001 | Kinsman et al. |
| 6,297,553 B1 * | 10/2001 | Horiuchi et al. ............ 257/737 |
| 6,300,149 B1 * | 10/2001 | Smith ..................... 438/15 |
| 6,309,909 B1 * | 10/2001 | Ohgiyama ................ 438/112 |
| 6,326,697 B1 * | 12/2001 | Farnworth ................ 257/779 |
| 6,326,700 B1 | 12/2001 | Bai et al. |
| 6,344,401 B1 * | 2/2002 | Lam ....................... 438/460 |
| 6,389,689 B2 * | 5/2002 | Heo ........................ 29/840 |
| 6,479,887 B1 * | 11/2002 | Yoon et al. ............... 257/666 |
| 6,498,387 B1 * | 12/2002 | Yang ...................... 257/620 |
| 6,566,745 B1 * | 5/2003 | Beyne et al. .............. 257/680 |

* cited by examiner

SEMICONDUCTOR DEVICE PACKAGE AND METHOD

FIELD OF THE INVENTION

The present invention relates to a method of packaging semiconductor devices. The present invention also relates to semiconductor device packages, including ball grid array (BGA) packages.

BACKGROUND OF THE INVENTION

A method of making ball grid array packages is described in U.S. patent application Ser. No. 09/317,957, filed May 25, 1999. According to that method, individual semiconductor devices are attached to a patterned strip, and then the devices are electrically connected to ball grid arrays on the opposite side of the strip, and then the strip is segmented to produce finished packages. A disadvantage associated with the method described in the '957 application is that each semiconductor device must be individually positioned with respect to the strip. The devices are spaced apart from each other along the length of the strip. Consequently, a separate alignment step is required for each package. In addition, since the semiconductor devices are separated from each other before they are connected to the ball grid arrays, the devices must be tested and burned-in separately. The entire disclosure of U.S. patent application Ser. No. 09/317,957 is expressly incorporated herein by reference.

Another method of making ball grid array packages is described in U.S. Pat. No. 5,858,815 (Heo). According to the Heo method, a wafer is attached to a film such that bond pads are exposed through openings in the film, and then the bond pads are connected to solder balls on the opposite side of the film, and then the layered assembly is sawed into chip-sized packages. There are numerous disadvantages associated with the Heo method. Among them is that the packages do not have sufficient stiffness. In addition, the prior art does not provide a satisfactory method of testing the Heo packages, and the prior art does not provide a suitable method of aligning the wafer with respect to the film.

The term "ball grid array" is used herein in a broad sense to include fine pitch ball grid arrays (FBGAs) within its definition.

SUMMARY OF THE INVENTION

The present invention overcomes many of the disadvantages of the prior art. The present invention relates to a method of making semiconductor device packages. The method includes the steps of forming a layered assembly by attaching a wafer to a dielectric layer, testing semiconductor devices in the wafer, and then dicing the layered assembly. The dielectric layer may be, for example, a flexible tape. The semiconductor devices may be chips containing integrated circuits or memory devices. The dicing operation may be performed by a circular saw or by another suitable dicing apparatus.

According to one aspect of the invention, the semiconductor devices are connected to input/output devices on the dielectric layer, before the testing and dicing steps. The input/output devices may be ball grid arrays (BGA) for board-on-chip (BOC) packages, if desired. The full wafer testing may be conducted through the ball grid arrays.

According to another aspect of the invention, defective packages identified during the testing step may be marked, segregated from the other packages, and discarded. The present invention should not be limited, however, to the specific methods and devices described in detail herein.

According to another aspect of the invention, a metal sheet may be included in the layered assembly before the testing and dicing steps. The metal sheet forms stiff metal layers in each of the finished packages. The metal layers may be used as heat spreaders and/or as electrical ground planes.

If desired, wire bonds may be used to connect the semiconductor devices to the ball grid arrays. In another embodiment of the invention, flip chip bumps on the semiconductor devices and conductive vias in the dielectric substrates are used to connect the semiconductor devices to the ball grid arrays. In either case, the electrical connections may be made after the wafer is adhered to the dielectric tape and before the layered assembly is diced into separate finished packages.

Alignment of the wafer with respect to the dielectric tape may be accomplished by an optical device or by a magnetic system. In a preferred embodiment of the invention, the active components of all of the semiconductor devices are simultaneously aligned to the respective connection devices on the tape.

The present invention also relates to a ball grid array package formed of a semiconductor device and a dielectric substrate. The edges of the device and the substrate are formed by a common sawing operation and as a consequence are aligned with each other. The package may also be provided with a stiff metal layer. The package may be tested before it is singulated from a wafer-tape assembly.

These and other features and advantages of the invention will be more clearly understood from the following detailed description of the invention which is provided in connection with the accompanying drawings.

DETAILED DESCRIPTION OF PREFERRED EMBODIMENTS

Figure 1:
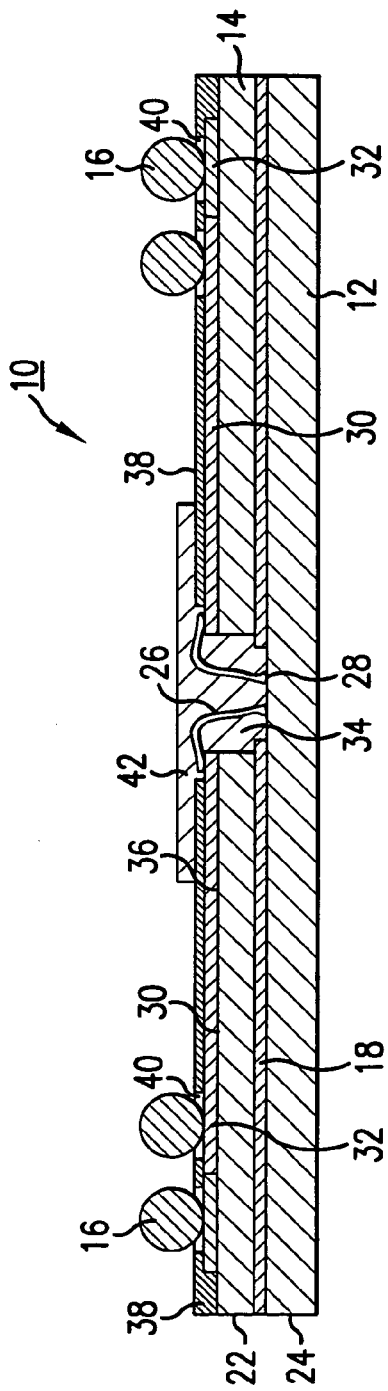
FIG. 1 is a cross-sectional view of a semiconductor device package constructed in accordance with the present invention.

Referring now to the drawings, where like reference numerals designate like elements, there is shown in FIG. 1 a semiconductor device package 10 constructed in accordance with one embodiment of the present invention. The package 10 has a semiconductor device 12, a dielectric substrate 14, and a ball grid array (BGA) 16. The semiconductor device 12 has an integrated circuit (not shown). A suitable adhesive 18 may be used to secure the semiconductor device 12 to the substrate 14. The semiconductor device 12 and the substrate 14 may be diced from a layered wafer-tape assembly 20 as described in more detail below in connection with FIG. 2. The dicing process causes the edges 22 of the substrate 14 to be aligned with the edges 24 of the semiconductor device 12.

The ball grid array 16 may be used to mechanically and electrically connect the package 10 to a circuit board (not shown). Wire bonds 26, bond pads 28, circuit traces 30, and ball pads 32 may be used to provide electrical communication between the semiconductor device 12 and the ball grid array 16. The wire bonds 26 extend through a slot-shaped opening 34. The traces 30 may be printed on the top surface 36 of the substrate 14 (before the semiconductor device 12 is adhered to the substrate 14). An insulative solder mask 38 extends over the traces 30. The mask 38 has openings 40 for receiving the individual balls of the ball grid array 16. A screen printing process may be used to apply the solder mask 38 as a paste to the entire surface of the substrate 14 except for the slot-shaped opening 34 and the ball pads 32. The wire bonds 26 and the bond pads 28 may be encapsulated in a suitable liquid encapsulant 42.

The substrate 14 may be a thin, flexible film. The film may be formed of a variety of dielectric materials, including for example FR-4/BT resins, epoxy, polyimide, KAPTON, UPLEX, and ceramic materials. The wire bonds 26 may be formed of gold, aluminum, copper or another suitable material. The traces 30 are formed of a conductive material such as copper, phosphor bronze, copper-nickel alloy, copper-nickel-tin alloy, or nickel-silver alloy. The adhesive 18 may be formed of a suitable die-attach material such as epoxy, resin, thermoplastic and/or elastomeric material. The ball grid array 16 may be formed of lead and/or tin. Alternatively, the ball grid array 16 may be formed of conductive polymer (metal suspended in a liquid). The present invention should not be limited to the specific materials and instrumentalities described in detail herein.

Figure 2:
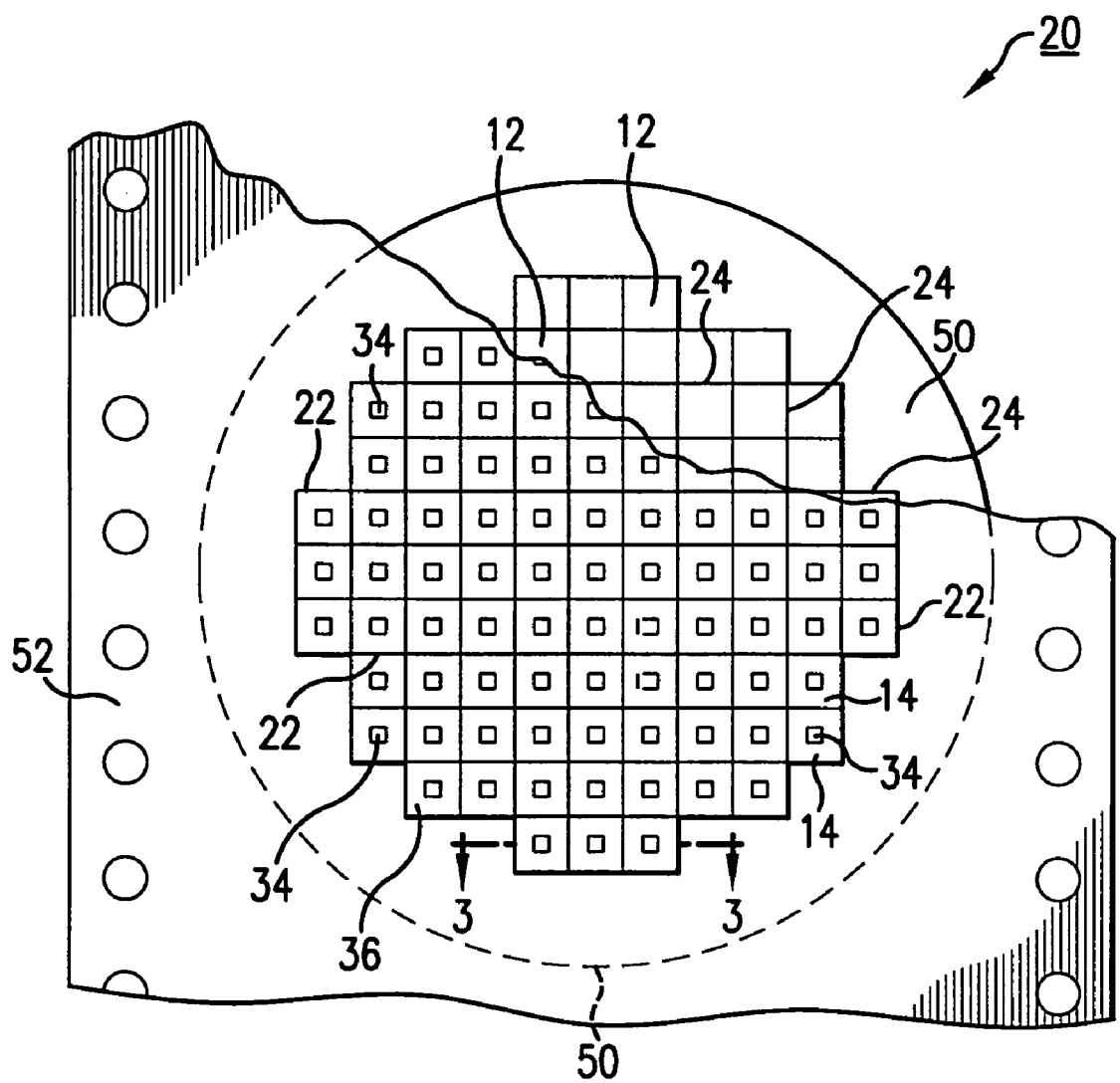
FIG. 2 is partial top view of a wafer-tape assembly constructed in accordance with the present invention, showing multiple packages in an intermediate stage of manufacture.

The wafer-tape assembly 20 shown in FIG. 2 is formed by aligning a silicon/semiconductor wafer 50 with respect to a slotted flexible tape 52. The wafer 50 contains many semiconductor devices 12. The tape 52 includes a corresponding number of slot-shaped openings 34. The bond pads 28 of the semiconductor devices 12 are aligned with the respective openings 34. (The bond pads 28, traces 30, and ball pads 32 are not shown in FIG. 2 for the sake of clarity of illustration.) Optical techniques may be used to achieve the desired alignment, and other suitable alignment methods are described below.

Figure 3:
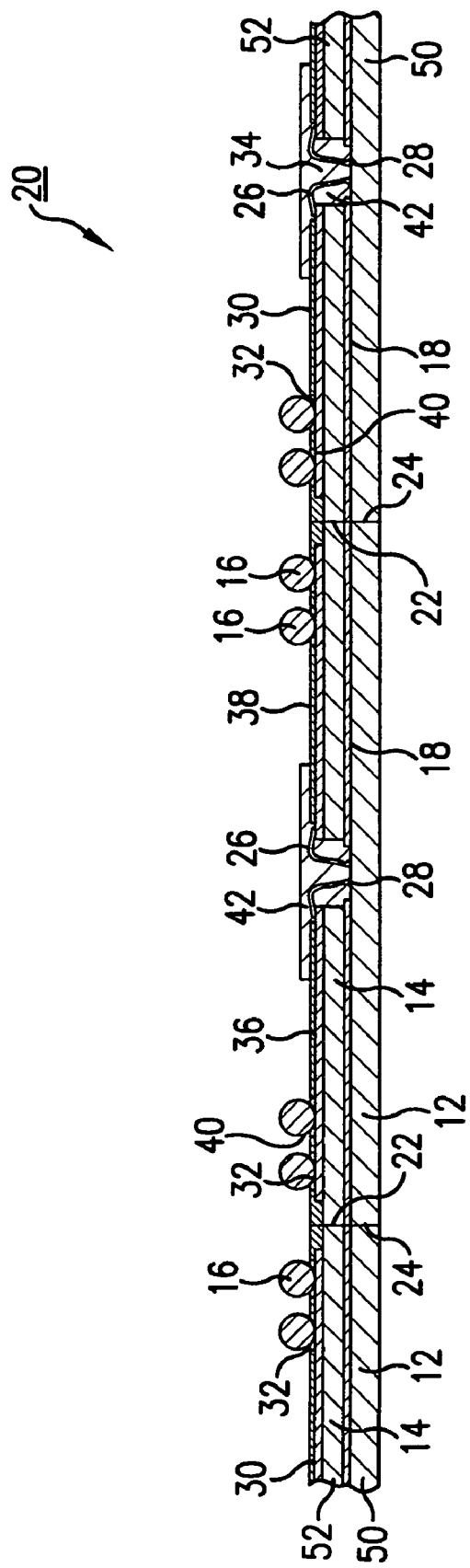
FIG. 3 is a cross-sectional view of the assembly of FIG. 2, taken along the line 3—3.

As shown in FIG. 3, the wafer 50 and the tape 52 are attached to each other by adhesive 18. The adhesive 18 may be screen printed onto the wafer 50 and/or the tape 52. The bond pads 28 are not covered by the adhesive 18. The attachment of the wafer 50 to the tape 52 may be accomplished by applying heat and/or pressure to the layered assembly 20. Alternatively, a gas evacuation/purge process may be used to remove gas from between adjacent layers 50, 52 of the assembly 20.

Although a slotted tape 52 is shown in the drawings, the present invention should not be limited to the specific structures shown and described in detail herein. In an alternative embodiment of the invention, a circular dielectric sheet having the same diameter as the wafer 50 may be used to form the substrates 14.

After the wafer 50 is adhered to the tape 52, the wire bonds 26 are installed to connect the bond pads 28 of the semiconductor devices 12 to the respective traces 30 on the top surface 36 of the tape 52. The ball grid arrays 16 are then placed on the ball pads 32, and the encapsulant 42 may be molded over the slot-shaped openings 34. Then the semiconductor devices 12 may be tested and burned-in through the ball grid arrays 16. After the full wafer 50 is tested and burned in, the assembly 20 is diced to form the individual packages 10. The dicing process may be accomplished by sawing through the assembly 20 along lines defined by the edges 22, 24 of the semiconductor devices 12 and substrates 14.

An advantageous aspect of the present invention is the ability to determine the functionality of the packages 10 by full wafer testing and burning-in the entire wafer-tape assembly 20, rather than testing and burning-in singulated packages. Specifically, before the individual packages 10 are diced from the assembly 20, all of the packages 10 may be tested, through the respective ball grid arrays 16, by a suitable testing apparatus. If any package 10 is found to be defective, known electronic mapping apparatus and methodologies may be used to electronically mark the defective package(s) 10 such that, subsequent to the dicing operation, the defective package(s) 10 may be discarded or segregated from the non-defective packages 10.

Figure 4:
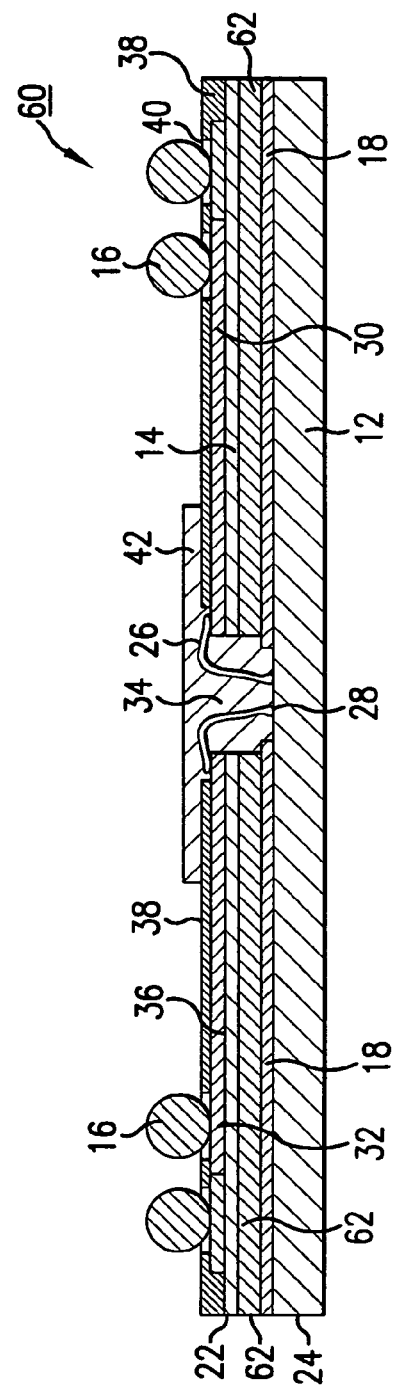
FIG. 4 is a cross-sectional view of another semiconductor device package constructed in accordance with the present invention.

FIG. 4 shows a semiconductor device package 60 constructed in accordance with another embodiment of the present invention. The package 60 has a metal layer 62 located between the semiconductor device 12 and the substrate 14. In the illustrated embodiment, the substrate 14 is laminated to the metal layer 62. The metal layer 62 may be used to stiffen the package 60. In addition, the metal layer 62 may be used as a heat sink to dissipate heat from the semiconductor device 12, and the metal layer 62 also may be used as an electrical ground plane in the manner described in the '957 application. The metal layer 62 may be formed of copper, alloy-42 or another suitable material. Copper is a preferred material because it provides an adequate coefficient of thermal expansion (CTE) match to the other materials of the package 60. In addition, copper has excellent thermal and electrical properties (namely, high conductivity).

The package 60 may be singulated from a wafer-tape assembly of the type shown in FIGS. 2 and 3. With respect to the FIG. 4 embodiment, however, a metal sheet (not shown) is located between the wafer 50 and the tape 52 before the dicing operation. The metal layer 62 is singulated from the metal sheet when the assembly is diced (after full wafer testing). The metal sheet may cover all of the semiconductor devices 12 in the wafer 50. The dicing operation causes the edges 64 of the metal layer 62 to be aligned with the edges 22, 24 of the substrate 14 and the semiconductor device 12. As in the embodiment of FIGS. 1–3, plural packages 60 may be tested and burned-in before they are singulated from the layered assembly.

Figure 6:
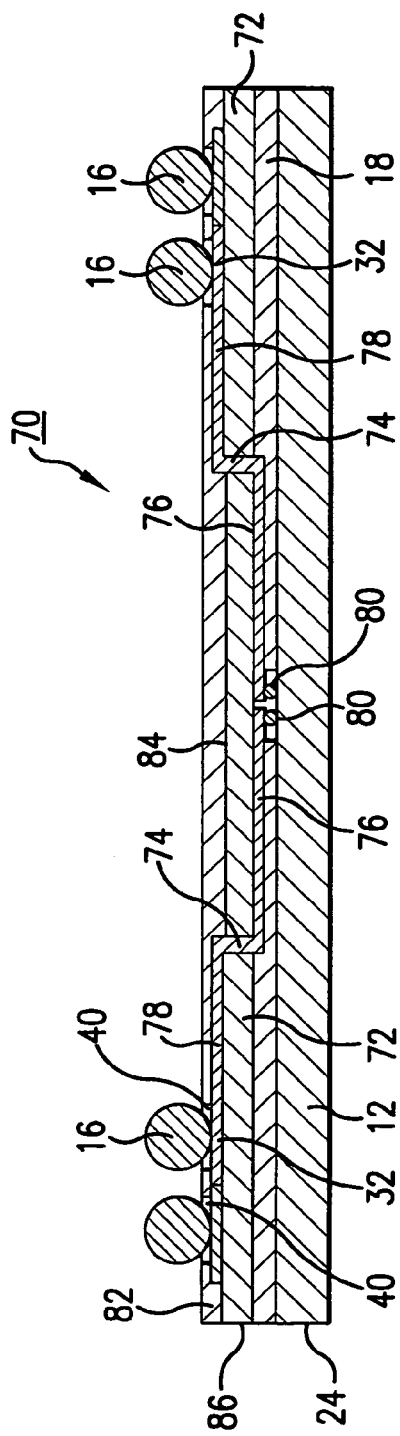
FIG. 6 is a cross-sectional view of another package constructed in accordance with the present invention.

FIG. 6 shows a semiconductor device package 70 constructed in accordance with yet another embodiment of the present invention. The package 70 has a dielectric substrate 72 with metal-plugged vias 74. In contrast to the packages shown in FIGS. 1–5, the package 70 of FIG. 6 does not have a slot-shaped opening 34 or encapsulant 42. In the FIG. 6 embodiment, interior and exterior circuit traces 76, 78 are patterned on the top and bottom surfaces of the substrate 72 to provide electrical communication between the semiconductor device 12 and the ball pads 32.

The interior traces 76 make contact with flip chip bumps 80 on the active surface of the semiconductor device 12, and the exterior traces 78 are connected to the interior traces 76 through the vias 74. If desired, the bumps 80 may be formed of a tin/lead alloy (e.g., 63% Sn/37% Pb). The bumps 80 may be reflowed to connect the semiconductor device 12 to the substrate 72. The area between the substrate 72 and the semiconductor device 12 may be underfilled with adhesive 18 or another suitable material, if desired. The diameter of each metal-plugged via 74 may be, for example, in a range from about 25 microns (0.001 inches) to about 200 microns (0.008 inches). The small vias 74 may be utilized to arrange a large number of circuits in a relatively small area.

As shown in FIG. 6, a solder mask 82 extends over the exterior traces 78. The mask 82 has openings 40 aligned with the ball pads 32 for receiving the solder balls and/or conductive bumps of the ball grid array 16. The mask 82 extends all the way across the central portion 84 of the substrate 72. Similarly to the FIGS. 1–5 embodiments, the package 70 shown in FIG. 6 may be singulated from a wafer-tape assembly. That is, the substrate 72 may be diced from a larger sheet of dielectric material (not shown) after the sheet is attached to a wafer 50, and after all of the packages 70 are tested and burned-in. The dicing operation causes the edges 24 of the semiconductor device 12 to be aligned with the edges 86 of the substrate 72.

Figure 7:
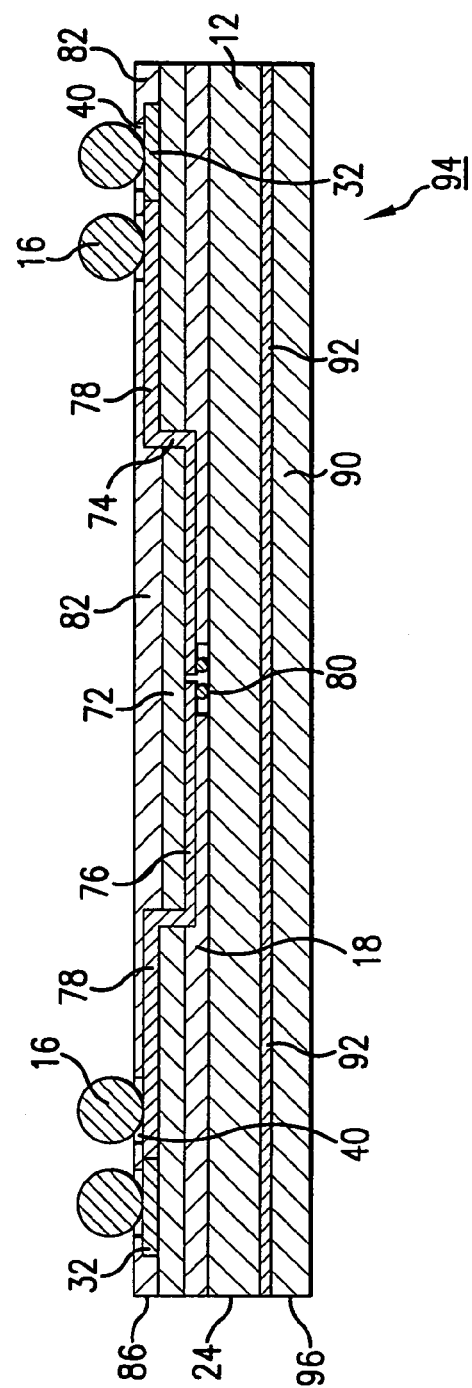
FIG. 7 is a cross-sectional view of yet another package constructed in accordance with the present invention.

If desired, a metal layer 90 (FIG. 7) may be attached to the semiconductor device 12 by a suitable adhesive 92. The thickness of the metal layer 90 may be in the range of from about 0.13 millimeters to about 0.25 millimeters. The metal layer 90 may operate as a heat sink or heat spreader to thermally stabilize the semiconductor device 12. In addition, the metal layer 90 may provide stiffness for the package 94. The metal layer 90 is preferably attached to the semiconductor device 12 before the device 12 is singulated from the wafer 50. This way, the metal layer 90 provides stiffness to the wafer-tape assembly prior to and during the dicing operation. The dicing operation causes the edges 96 of the metal layer 90 to be aligned with the edges 24, 86 of the semiconductor device 12 and the substrate 72.

Figure 8:
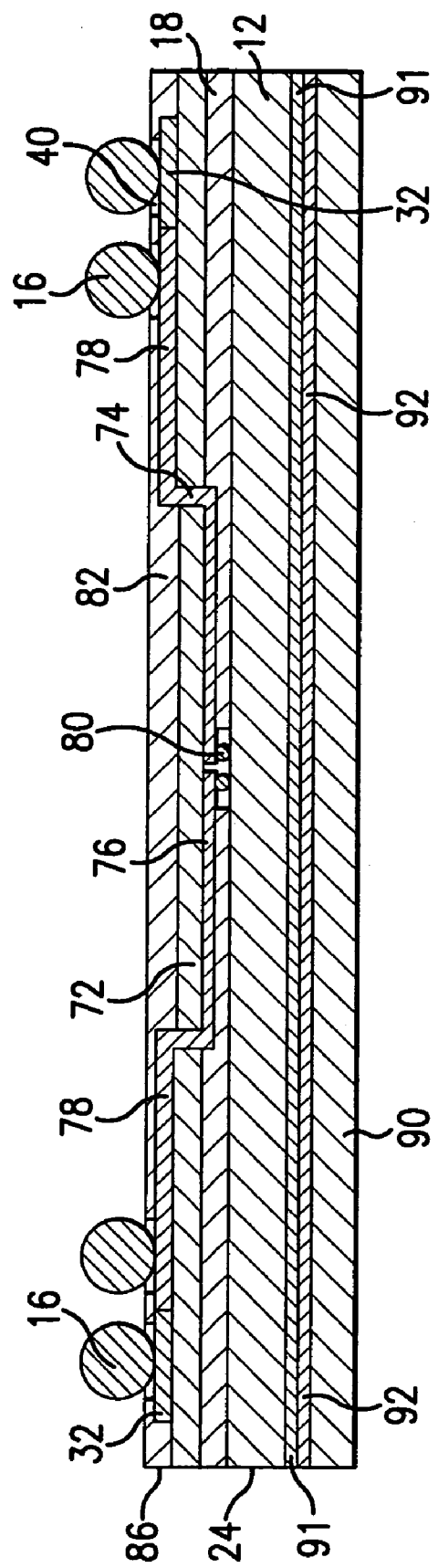
FIG. 8 is a cross-sectional view of yet another package constructed in accordance with the present invention.

According to an alternative embodiment of the invention, a thin layer of metal 91 (FIG. 8) is located on the back side of the semiconductor device 12. A layer of adhesive 92 is located between the thin layer of metal 91 and a thicker metal layer 90. The adhesive 92 may extend through the thin layer of metal 91 to provide adherence to the semiconductor device 12. The thickness of the thin layer of metal 91 may be about 0.00254 millimeters. The product shown in FIG. 8 otherwise may be the same as the one shown in FIG. 7.

Figure 9:
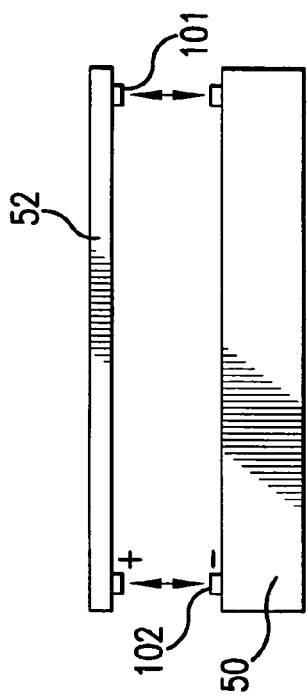
FIG. 9 illustrates a magnetic system for aligning the wafer-tape assembly of FIGS. 2 and 3.
Figure 10:
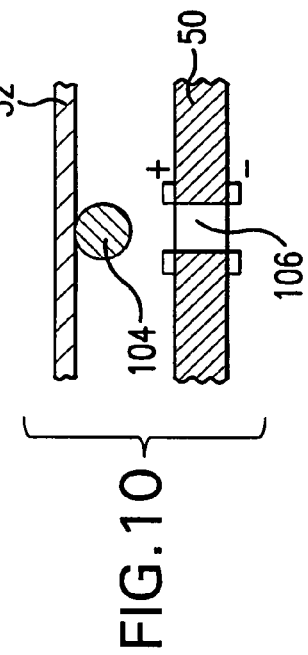
FIG. 10 illustrates another magnetic alignment system constructed in accordance with the present invention.
Figure 5:
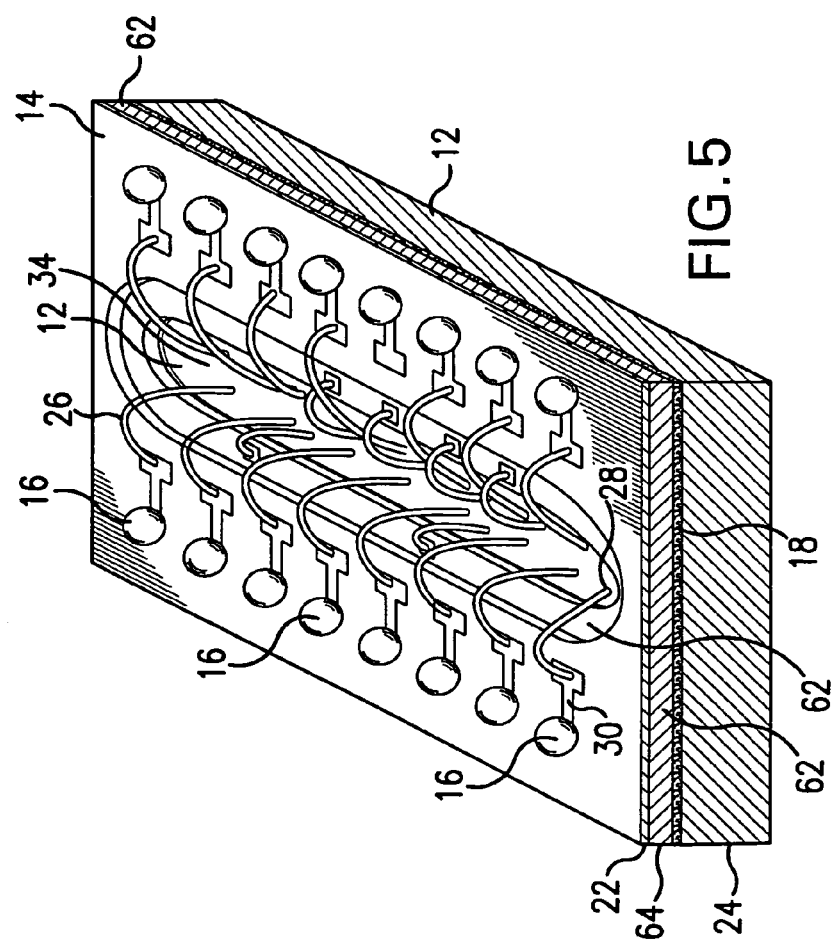
FIG. 5 is a perspective view of a package similar to the one shown in FIG. 4.

Referring now to FIG. 9, magnetic devices 100, 102 may be used to align the wafer 50 with respect to the dielectric tape 52. The devices 100, 102 may be oppositely charged (+/−) so that they are attracted to each other. The illustrated alignment method may be used to ensure that the die pads 28 of the wafer 50 are aligned with the corresponding openings 34 in the layered assembly 20 of FIGS. 2 and 3. FIG. 10 shows an alternative alignment method, in which a magnetic ring 104 is formed in the tape 52 and an oppositely charged slot 106 is formed in the wafer 50. The ring 104 is caused to center itself within the slot 106, such that the wafer 50 is adequately aligned with the tape 52 to form the assembly 20 of FIGS. 2 and 3. In an alternative embodiment of the invention, the ring 104 may be provided on the wafer 50 and the charged slot 106 may be formed in the dielectric tape 52. An advantage of the present invention is that a separate magnetic alignment system 100–106 is not required for each individual package 10, 60, 70, 94.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of making semiconductor device packages, comprising:
   forming a plurality of conductive traces in contact with a top surface of an integral dielectric substrate, the plurality of conductive traces being located on said substrate in correspondence with a plurality of semiconductor devices in a wafer;
   subsequently, forming a layered assembly by attaching said wafer to said integral dielectric substrate, such that said plurality of conductive traces are in electrical communication with said plurality of semiconductor devices in said wafer;
   forming input/output devices in contact with said conductive traces;
   testing semiconductor devices in said wafer; and
   subsequently, dicing said layered assembly.

2. The method of claim 1, further comprising the step of connecting said semiconductor devices to said input/output devices.

3. The method of claim 2, wherein said testing is conducted through said input/output devices.

4. The method of claim 3, further comprising the step of discarding one or more defective packages.

5. The method of claim 1, wherein said step of forming said layered assembly comprises the step of adhering said wafer to said integral dielectric substrate.

6. The method of claim 5, further comprising the step of electrically connecting said semiconductor devices to ball grid arrays on said integral dielectric substrate.

7. The method of claim 6, wherein said connecting step comprises the step of locating wire bonds in openings through said integral dielectric substrate.

8. The method of claim 6, wherein said connecting step comprises the step of connecting solder bumps on said wafer to circuit traces on said integral dielectric substrate.

9. The method of claim 6, wherein said dicing step is performed by a saw.

10. The method of claim 6, further comprising the step of providing a metal layer in said layered assembly.

11. A method of making semiconductor device packages, comprising:
   providing a plurality of conductive structures in contact with a top surface of an integral dielectric substrate, the plurality of conductive structures being located on said substrate in correspondence with a plurality of semiconductor devices in a semiconductor wafer;
   subsequently, forming a layered assembly by attaching said semiconductor wafer and a stiff metal layer to said integral dielectric substrate with said conductive structures electrically connecting with said semiconductor devices;

placing ball grid arrays in contact with said conductive structures;

electrically connecting said plurality of semiconductor devices in said semiconductor wafer to said ball grid arrays;

determining whether said semiconductor wafer contains a defective semiconductor device; and subsequently, dicing said layered assembly.

12. The method of claim 11, wherein said forming step comprises the step of adhering said semiconductor wafer to said metal layer.

13. The method of claim 11, wherein said connecting step comprises the step of locating wire bonds in openings in said integral dielectric substrate.

14. The method of claim 13, further comprising the step of connecting said wire bonds to conductive traces on said integral dielectric substrate.

15. The method of claim 11, wherein said connecting step comprises the step of connecting solder bumps on said semiconductor wafer to conductive traces on said integral dielectric substrate.

16. The method of claim 15, further comprising the step of connecting said conductive traces to conductive vias extending through said integral dielectric substrate.

17. The method of claim 11, wherein said dicing step is performed by a saw.

18. The method of claim 11, further comprising the step of testing said semiconductor devices through said ball grid arrays.

19. A method of making semiconductor device packages, comprising:

simultaneously aligning a plurality of semiconductor devices in a semiconductor wafer with respect to a plurality of pre-existing openings in a dielectric tape, before attaching said semiconductor wafer to said dielectric tape;

subsequently, attaching said semiconductor wafer to said dielectric tape;

connecting said semiconductor devices in said semiconductor wafer to ball grid arrays on said dielectric tape; and simultaneously dicing said semiconductor wafer and said dielectric tape.

20. The method of claim 19, wherein said semiconductor wafer is optically aligned with respect to said dielectric tape.

21. The method of claim 19, wherein said semiconductor wafer is magnetically aligned with respect to said dielectric tape.

22. The method of claim 21, wherein oppositely charged magnetic elements are provided on said semiconductor wafer and said dielectric tape.

23. The method of claim 21, further comprising the step of locating a magnetic ring in a charged slot.

24. The method of claim 19, wherein said step of attaching said semiconductor wafer to said dielectric tape comprises applying heat or pressure to the assembly.

25. The method of claim 19, wherein the step of attaching said semiconductor wafer to said dielectric tape comprises evacuating gas from said assembly.

26. A method of handling a plurality of semiconductor devices arrayed in a semiconductor wafer, comprising:

adhering said semiconductor wafer to an integral flexible substrate, said integral flexible substrate comprising a plurality of ball grid arrays corresponding with said plurality of semiconductor devices;

connecting said semiconductor devices to respective ball grid arrays located on said integral flexible substrate;

testing said semiconductor devices through said ball grid arrays; and subsequently, singulating packages from said semiconductor wafer and said integral flexible substrate, such that edges of each piece of said singulated semiconductor wafer and each piece of said singulated flexible substrate are aligned with each other.

27. The method of claim 26, further comprising the step of identifying defective packages.

28. The method of claim 27, further comprising the step of segregating said defective packages from other packages.

* * * * *